United States Patent
Cai et al.

(10) Patent No.: US 10,032,772 B2
(45) Date of Patent: Jul. 24, 2018

(54) INTEGRATED CIRCUITS WITH HIGH VOLTAGE DEVICES AND METHODS FOR PRODUCING THE SAME

(71) Applicant: Globalfoundries Singapore Pte. Ltd., Singapore (SG)

(72) Inventors: Xinshu Cai, Singapore (SG); Fan Zhang, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 128 days.

(21) Appl. No.: 15/268,836

(22) Filed: Sep. 19, 2016

(65) Prior Publication Data

US 2018/0082999 A1    Mar. 22, 2018

(51) Int. Cl.
  *H01L 21/31* (2006.01)
  *H01L 21/469* (2006.01)
  *H01L 27/088* (2006.01)
  *H01L 29/06* (2006.01)
  *H01L 23/528* (2006.01)
  *H01L 21/8234* (2006.01)

(52) U.S. Cl.
  CPC .... *H01L 27/088* (2013.01); *H01L 21/823437* (2013.01); *H01L 21/823462* (2013.01); *H01L 21/823475* (2013.01); *H01L 21/823481* (2013.01); *H01L 23/5283* (2013.01); *H01L 29/0649* (2013.01)

(58) Field of Classification Search
  CPC ............... H01L 21/2652; H01L 27/115; H01L 27/11521; H01L 29/66825; H01L 29/7883; H01L 29/788; H01L 27/098; H01L 29/42316; H01L 29/66901; H01L 29/808; H01L 29/0843; H01L 29/45; H01L 21/337; H01L 21/33
  See application file for complete search history.

(56) References Cited

U.S. PATENT DOCUMENTS

| | | | |
|---|---|---|---|
| 6,797,568 B1 | 9/2004 | Hu | |
| 2002/0030223 A1* | 3/2002 | Narita | H01L 21/76224 257/314 |
| 2007/0066087 A1* | 3/2007 | Jung | H01L 27/105 438/786 |
| 2008/0272406 A1* | 11/2008 | Banna | H01L 27/098 257/270 |

* cited by examiner

*Primary Examiner* — Charles Garber
*Assistant Examiner* — Abdulfattah Mustapha
(74) *Attorney, Agent, or Firm* — Lorenz & Kopf, LLP

(57) ABSTRACT

Methods of fabricating integrated circuits and integrated circuits fabricated by those methods are provided. In an exemplary embodiment, a method includes providing a substrate having a first and second device wells, a gate dielectric overlying the first and second device wells, a first gate electrode layer overlying the gate dielectric, and a shallow trench isolation structure between the first and second device wells. An insulating dielectric layer is formed only partially overlying the first gate electrode layer. A second gate electrode material is deposited overlying at least the insulating dielectric layer to form a second gate electrode layer. The layers are patterned to form a second gate structure overlying the second device well. A contact is formed on the second gate electrode layer of the second gate structure with the contact overlying dielectric material of at least one of the insulating dielectric layer or the shallow trench isolation structure.

20 Claims, 14 Drawing Sheets

INTEGRATED CIRCUITS WITH HIGH VOLTAGE DEVICES AND METHODS FOR PRODUCING THE SAME

TECHNICAL FIELD

The technical field generally relates to integrated circuits with memory cells and high voltage devices, and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components within the integrated circuits. Many integrated circuits include memory cells to store information and other components, such as transistors that operate at various operating voltages, such as low (from about 1 to about 1.5 V), medium (from about 5 to about 8 V), and high (from about 10 to about 40), voltage devices. Memory cells are an important part of many microelectronic components, and smaller and more reliable memory cells are desirable (e.g., 28 nm and beyond). As the memory cells decrease in size, it is also desirable to decrease the size of the high voltage devices of the integrated circuit. These high voltage devices typically include a gate structure overlying a device well with the gate structure including a gate dielectric (e.g., a gate oxide) overlying the device well, a high-κ metal gate overlying the gate dielectric, a gate electrode (e.g., a polycrystalline silicon or metal layer) overlying the high-κ metal gate, and a contact overlying the gate electrode.

However, decreasing the size of the high voltage devices presents challenges to the reliability of the devices. For example, as the size of the high voltage devices decreases, reliability of its high-κ metal gate becomes a concern. While attempts have been made to eliminate the high-κ metal gate in these devices, devices without the high-κ metal gate are prone to diffusion of metal ions from the contact through the gate electrode and into the gate dielectric, which in turn may negatively impact operation of the device.

Accordingly, it is desirable to provide integrated circuits including memory cells and high voltage devices with the high voltage devices free of high-κ metal gates, and methods of producing the same. In addition, it is desirable to provide the integrated circuits including memory cells and high voltage devices utilizing existing processing stages. Moreover, other desirable features and characteristics of the present embodiment will become apparent from the subsequent detailed description and the appended claims, taken in conjunction with the accompanying drawings and this background of the invention.

BRIEF SUMMARY

Methods for fabricating integrated circuits and integrated circuits fabricated by those methods are provided herein. In an embodiment, a method for fabricating an integrated circuit includes providing a semiconductor substrate having a first device well and a second device well, a gate dielectric overlying the first device well and the second device well, a first gate electrode layer overlying the gate dielectric, and a shallow trench isolation structure within the substrate between the first device well and the second device well. An insulating dielectric layer is formed only partially overlying the first gate electrode layer. A second gate electrode material is deposited overlying at least the insulating dielectric layer to form a second gate electrode layer. The at least the gate dielectric layer and the second gate electrode layer are patterned to form a first gate structure overlying the first device well and a second gate structure overlying the second device well. A contact is formed on the second gate electrode layer of the second gate structure with the contact overlying dielectric material of at least one of the insulating dielectric layer or the shallow trench isolation structure.

In another embodiment, a method for fabricating an integrated circuit includes providing a semiconductor substrate having a first device well and a second device well. A gate dielectric is formed overlying the first device well and the second device well. A first gate electrode layer is formed overlying the gate dielectric. A shallow trench isolation structure is formed within the substrate between the first device well and the second device well after forming the first gate electrode layer such that the first gate electrode layer is defined by forming the shallow trench isolation structure. An insulating dielectric layer is formed overlying the first gate electrode layer. A second gate electrode layer is formed overlying the insulating dielectric layer. A contact is formed on the second gate electrode layer with the contact overlying dielectric material of at least one of the insulating dielectric layer or the shallow trench isolation structure.

In another embodiment, an integrated circuit includes a semiconductor substrate having a first device well and a second device well, and a shallow trench isolation structure within the substrate between the first device well and the second device well. A first gate structure overlies the first device well. The first gate structure includes a gate dielectric overlying the first device well, a first gate electrode layer overlying the gate dielectric, an insulating dielectric layer overlying the first gate electrode layer, and a second gate electrode layer overlying the insulating dielectric layer. A second gate structure overlies the second device well. The second gate structure includes a gate dielectric overlying the second device well, optionally, a first gate electrode layer overlying the gate dielectric, optionally, an insulating dielectric layer partially overlying the first gate electrode layer, a second gate electrode layer overlying dielectric material of at least one of the insulating dielectric layer or the gate dielectric; and a contact formed on the second gate electrode layer with the contact overlying dielectric material of at least one of the insulating dielectric layer or the shallow trench isolation structure.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Methods for fabricating integrated circuits are provided herein. In particular, the integrated circuits formed in accordance with the methods that are described herein omit the high-κ metal gates from the devices and processing steps are incorporated during manufacturing to form the high voltage devices concurrent with formation of other devices within the integrated circuits, such as non-volatile memory devices. Features conventionally formed during formation of the non-volatile memory devices are also formed in the high voltage devices and prevent diffusion of the gate electrodes into the gate dielectric, thereby enabling elimination of high-k gate dielectric and enabling conventional gate dielectric materials to be employed without the attendant problems attributable to metal ion diffusion. Specific processes are described in further detail below. Because the high voltage devices are typically fabricated on integrated circuits that also include non-volatile memory devices, coordinated manufacturing processes for both the memory cells and the high voltage devices of the integrated circuit are utilized without the need to add further processing stages.

Figure 1:
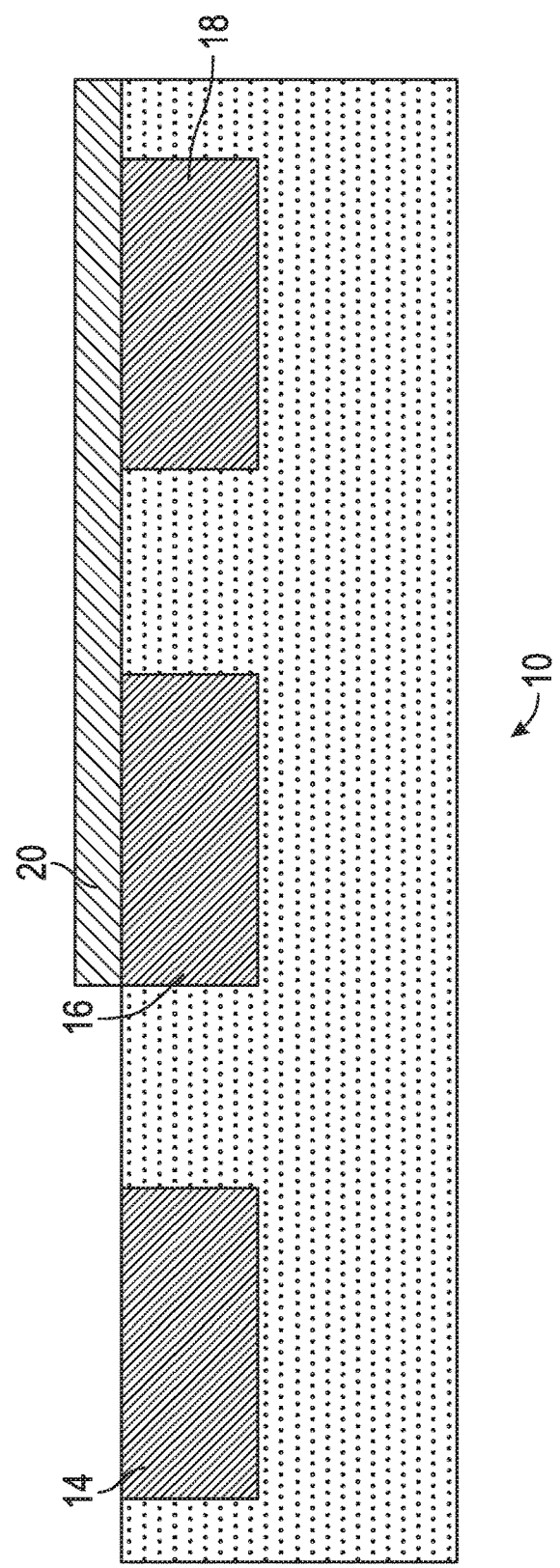
FIGS. 1-14 illustrate, in cross sectional views, an integrated circuit and methods for fabricating the same in accordance with exemplary embodiments.

An exemplary method for fabricating an integrated circuit will now be described with reference to FIGS. 1-14. Referring to FIG. 1, a semiconductor substrate 10 including a semiconductor material is provided. The semiconductor material may be any semiconductor material that is known for industrial use in electronic devices including monocrystalline silicon materials, polycrystalline silicon materials, and silicon admixed with other elements such as germanium, carbon, and the like. Examples of the semiconductor material include, but are not limited to, those chosen from silicon, silicon germanium (SiGe), germanium (Ge), gallium arsenide (GaAs), or indium phosphide (InP). For example, in an embodiment, the semiconductor material is silicon, and the silicon is present in an amount of from about 95 to about 100 mol %, such as from about 99 to about 100 mol %, based upon the total amount of atoms in the semiconductor substrate 10. The silicon may be substantially pure, i.e., dopants and/or impurities are present in amounts of less than or equal to 1 mol % based upon the total amount of atoms in the semiconductor substrate 10 and are desirably absent from the semiconductor substrate 10. An exemplary semiconductor material is a silicon substrate. The silicon substrate may be a bulk silicon wafer or may be a thin layer of silicon on insulating layer (commonly known as silicon-on-insulator or SOI) that, in turn, is supported by a carrier wafer.

In an embodiment and as shown in FIG. 1, the semiconductor substrate 10 has a first device well 14 and a second device well 16. The semiconductor substrate 10 may also have a third device well 18 adjacent to the second device well 16. It is to be appreciated that while only three wells are shown in the Figures and referred to in the description below, the semiconductor substrate 10 may have millions of wells with many having the configuration of the first device well 14, the second device well 16, and optionally the third device well 18. The wells 14, 16, 18 are formed in the semiconductor substrate 10 through conventional fabrication techniques. The wells 14, 16, 18 have a dopant concentration, or a concentration of conductivity determining ions, and the conductivity determining ions may be, independently, P-type or N-type conductivity determining ions, depending upon whether a P-type device or N-type device is to be formed. Each of the wells 14, 16, 18 contain opposite conductivity determining ions from the source region and drain region that are to be formed therein. For example, when the source region (not shown) and drain region (not shown) for a device include P-type conductivity determining ions, the wells 14, 16, 18 include N-type conductivity determining ions, and vice versa. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof.

In an embodiment and as also shown in FIG. 1, a first gate dielectric layer 20 is formed overlying the second device well 16 and the third device well 18. As used herein, the term "overlying" means "over" such that an intervening layer may lay between the first gate dielectric layer 20 and the second device well 16, or "on" such that the first gate dielectric layer 20 physically contacts the second device well 16. Moreover, the term "directly overlying" means a vertical line passing through the upper component also passes through the lower component, such that at least a portion of the upper component is directly over at least a portion of the lower component. It is understood that the integrated circuit may be moved such that the relative "up" and "down" positions change, so reference to a "vertical" line means a line that is about perpendicular to the surface of the substrate 10. To form the first gate dielectric layer 20, a first gate dielectric material is deposited overlying the first device well 14, the second device well 16, and the third device well 18. The first gate dielectric layer 20 may then be patterned to expose the first device well 14 such that the first device well 14 is free of the first gate dielectric layer 20 thereover, and the second device well 16 and the third device well 18 remain overlaid by the first gate dielectric layer 20. Patterning may include formation of a photoresist layer (not illustrated) and a mask (not illustrated), and etching the first gate dielectric layer 20 with an appropriate etchant to expose the first device well 14. The first gate dielectric material may include, but is not limited to, silicon dioxide (commonly referred to as "silicon oxide"), silicon nitride, or the like. Silicon dioxide may be deposited by chemical vapor deposition (CVD) using a variety of deposition gases, including silane and oxygen, dichlorosilane and nitrous oxide, or tetraethylorthosilicate, and may be etched with a hydrofluoric acid liquid etchant, which may be diluted with water or buffered and diluted with ammonium fluoride. Silicon nitride may be deposited by low pressure chemical vapor deposition (LPCVD) using ammonia and dichlorosilane, and may be etched using plasma etch with hydrogen and nitrogen trifluoride ($NF_3$), or plasma etch with oxygen ($O_2$), nitrogen ($N_2$), and nitrogen trifluoride ($NF_3$).

Figure 2:
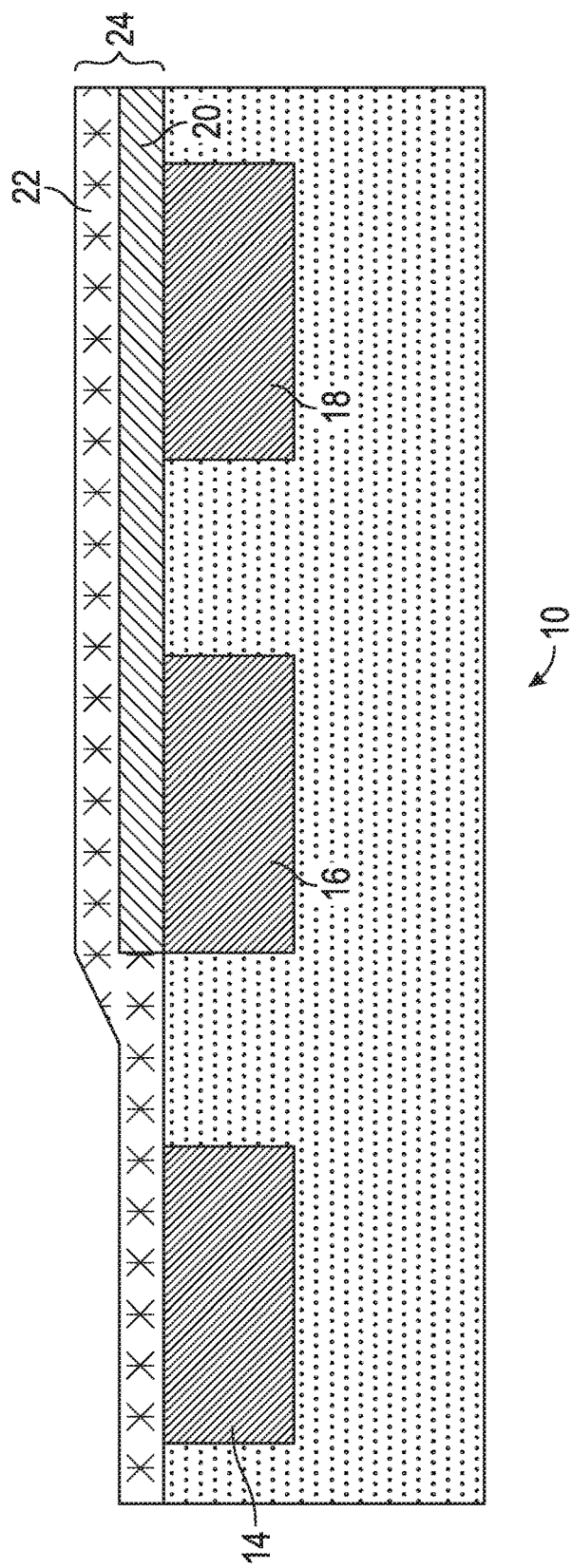

In an embodiment and as shown in FIG. 2, a second gate dielectric material is deposited overlying the first device well 14 and over the first gate dielectric layer 20 to form a second gate dielectric layer 22. The second gate dielectric material may include, but is not limited to, silicon dioxide, silicon nitride, or the like. Silicon dioxide and silicon nitride may be formed as described above. The first gate dielectric layer 20 and the second gate dielectric layer 22 together form a gate dielectric 24 overlying the second device well 16, and the third device well 18. Only the second gate dielectric layer 22 remains over the first device well 14 and forms the gate dielectric 24 for the first device well 14. Said differently, the gate dielectric 24 includes the first gate dielectric layer 20 and second gate dielectric layer 22 over the second device well 16 and the third device well 18, but only includes the second gate dielectric layer 22 over the first device well 14. Because the gate dielectric 24 overlying the second device well 16 and the third device well 18 can be made thicker as compared to the gate dielectric 24 overlying the first device well 14, the second device well 16 and the third device well 18 can be utilized with high voltage devices, as will be described in greater detail below.

Figure 3:
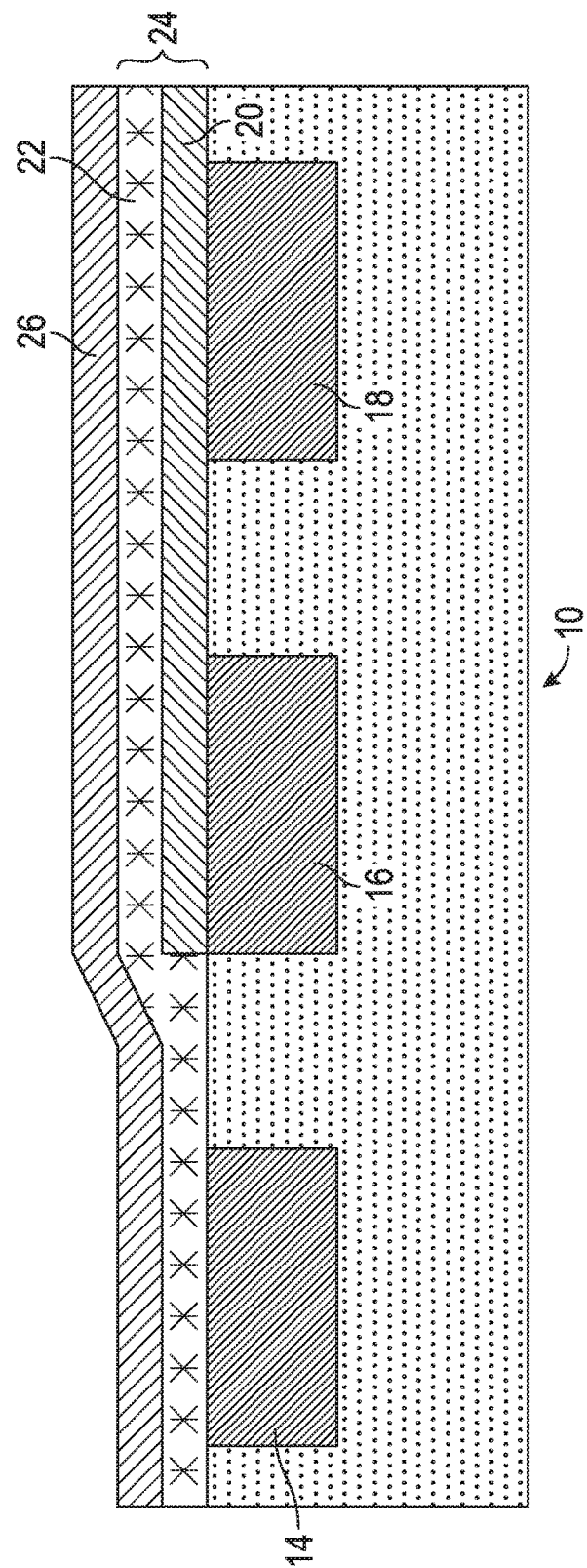

In an embodiment and as shown in FIG. 3, a first gate electrode material is deposited overlying the gate dielectric 24, more particularly over the second gate dielectric layer 22, to form the first gate electrode layer 26. The first gate electrode material may include, but is not limited to, conventional materials including copper, silver, and doped or polycrystalline silicon. In certain embodiments, the first gate electrode material includes polycrystalline silicon with impurities. In an exemplary embodiment, first gate electrode material includes phosphorous for electron storage, and may also include carbon doped polycrystalline silicon or other materials. Polycrystalline silicon may be formed by low pressure chemical vapor deposition (LPCVD) in a silane environment, and the dopant may be included with the silane during deposition or implanted after the first gate electrode layer 26 is formed.

Figure 4:
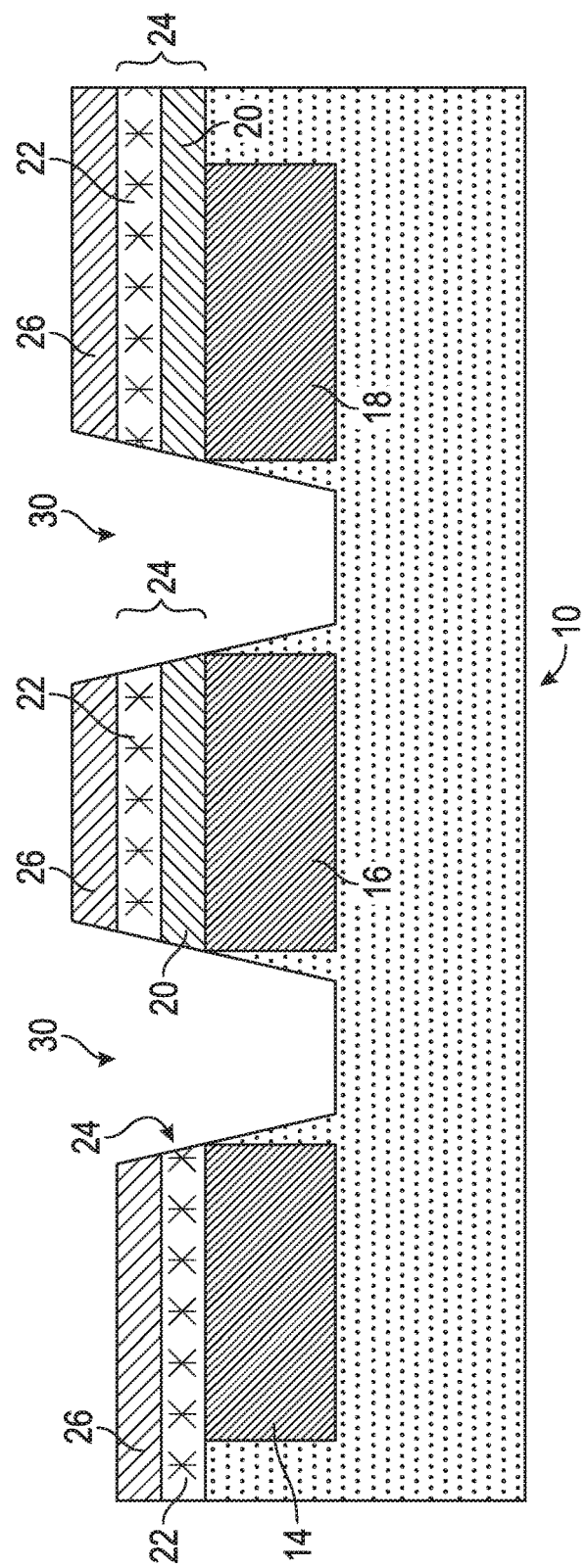
Figure 5:
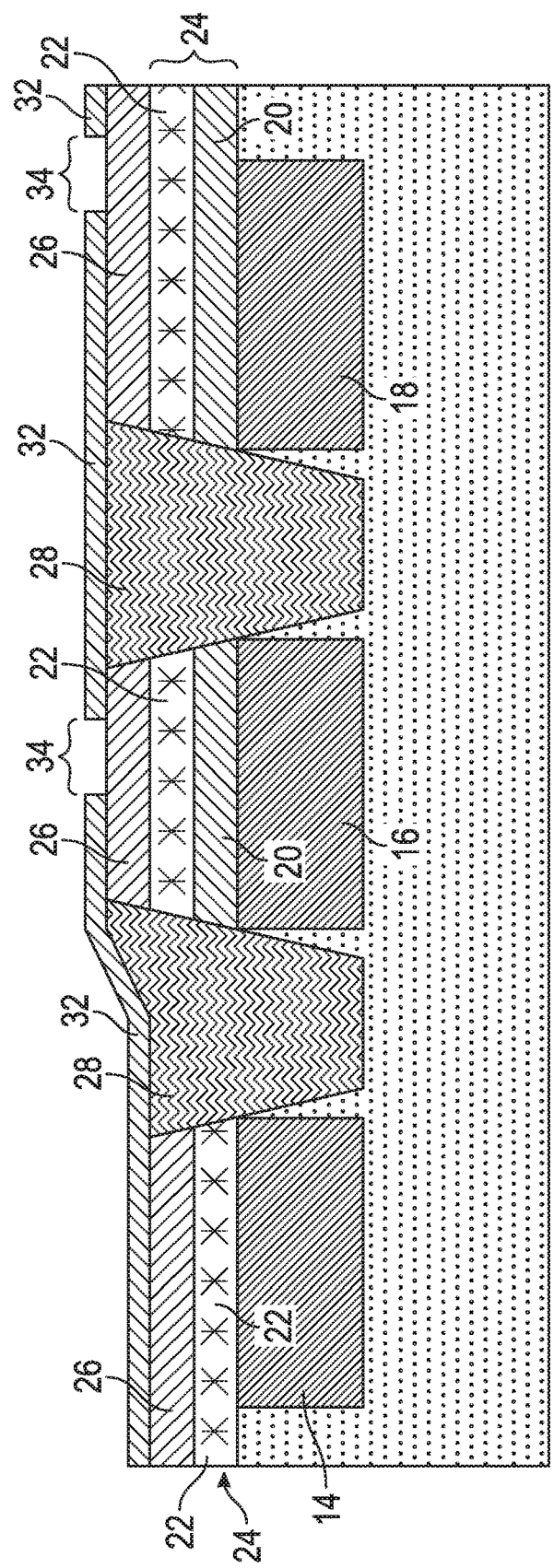

In an embodiment and as shown in FIGS. 4 and 5, shallow trench isolation (STI) structures 28 are formed within the semiconductor substrate 10 between the first device well 14 and the second device well 16, and between the second device well 16 and the third device well 18. The STI structures 28 may be formed after forming the first gate electrode layer 26 such that the first gate electrode layer 26 is defined by forming the STI structures 28.

The STI structures 28 may be formed within the semiconductor substrate 10 through conventional lithography techniques. Referring specifically to FIG. 4, in an exemplary embodiment, the STI structures 28 are formed by first forming trenches 30. To form the trenches 30, a photoresist layer (not illustrated) and a mask (not illustrated) are formed and patterned to expose the mask at the desired locations of the trenches 30. Next, the trenches 30 may be formed within the semiconductor substrate 10 by anisotropically etching the mask, the first gate electrode layer 26, the gate dielectric 24, and into the semiconductor substrate 10 utilizing a reactive ion etch with silicon hexafluoride. The photoresist layer may then be removed with an oxygen containing plasma, and an electrically insulating material such as silicon dioxide may be deposited within the trenches 30. Silicon dioxide may be deposited as described above. Overburden can then be removed by chemical mechanical planarization (CMP). By forming the STI structures 28 after forming the first gate electrode later 26, self-alignment between the wells 14, 16, 18 and the first gate electrode layer 26 is achieved.

Referring specifically to FIG. 5, in an exemplary embodiment, an insulating dielectric layer 32 is formed only partially overlying the first gate electrode layer 26, with at least a portion of the insulating dielectric layer 32 removed over the second device well 16 and the third device well 18. The phrase "only partially overlying" with reference to the insulating dielectric layer 32 means that the insulating dielectric layer 32 overlies a surface of the first gate electrode layer 26 over the first device well 14 but only overlies the second device well 16 or the third device well 18 in an amount of no greater than 99%, 95%, 90%, 80%, 70%, or 50%, based on total surface area of the first gate electrode layer 26 overlying the second device well 16 or the third device well 18. To form the insulating dielectric layer 32, an insulating dielectric material is deposited overlying the first gate electrode layer 26. The insulating dielectric layer 32 may then be patterned to expose portions 34 of the first gate electrode layer 26 overlying the second device well 16 and the third device well 18. In certain embodiments, the portions 34 are exposed through the insulating dielectric layer 32 in an amount of no greater than 99%, 90%, 75%, 50%, 25%, 20%, 15%, or 10%, alternatively, in an amount of from at least 1%, 10%, 15%, 20%, 25%, 50%, 75%, 90%, or 99%, or alternatively, in an amount of from 1 to 99%, 10 to 99% 10 to 90%, 10 to 75%, or 10 to 50%, based on total surface area of the first gate electrode layer 26 directly overlying the second device well 16 and the third device well 18. Patterning may include formation of a photoresist layer (not illustrated) and a mask (not illustrated), and etching with an appropriate etchant to expose the portions 34. In an exemplary embodiment, the insulating dielectric layer 32 includes a silicon dioxide layer underlying a silicon nitride layer that in turn underlies a silicon dioxide layer (where each layer is not individually illustrated), which may be referred to as an oxide-nitride-oxide (ONO) layer, but other electrically insulating materials may be used in insulating dielectric layer 32 in alternate embodiments. Silicon dioxide and silicon nitride can be deposited as described above, and etched with an appropriate isotropic etch. In certain embodiments, the insulating dielectric layer 32 is formed such that the exposed portions 34 of the first gate electrode layer 26 directly overlie the second device well 16 and the third device well 18.

Figure 6:
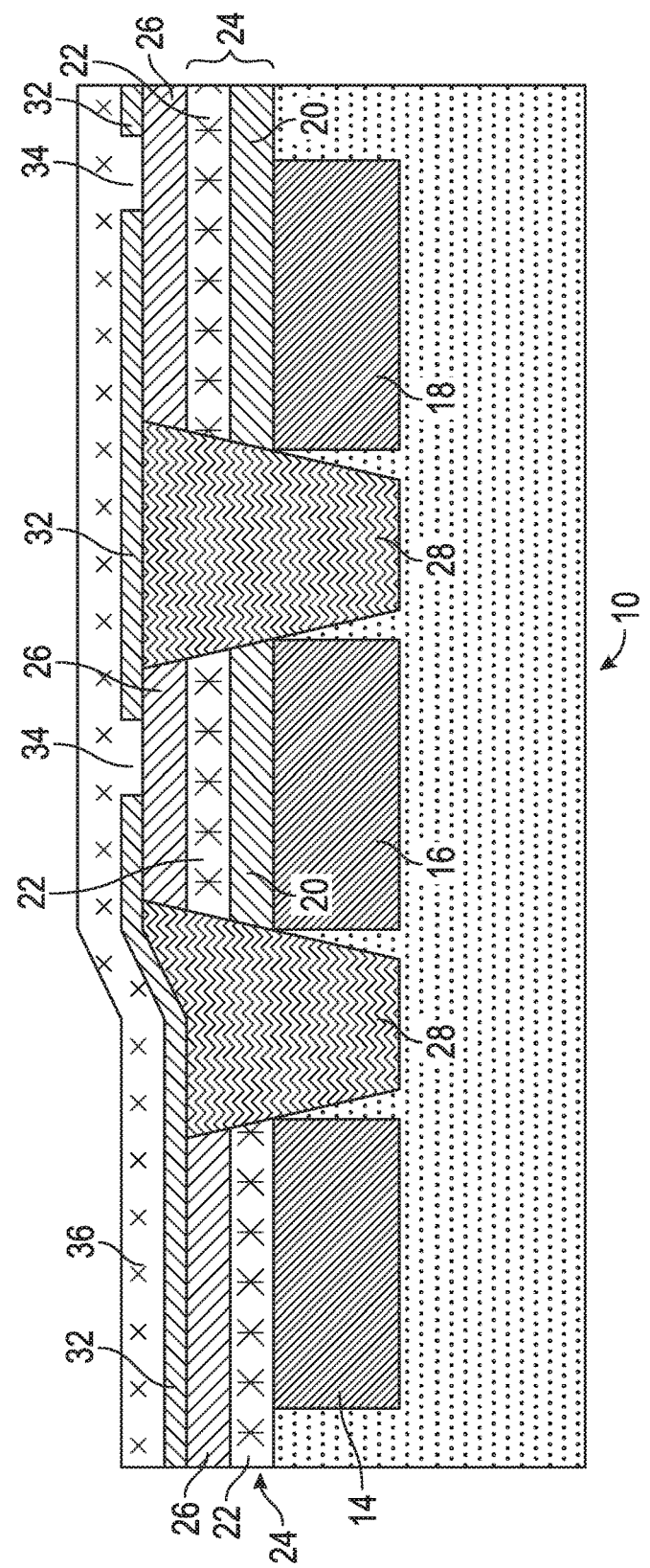

In an embodiment and as shown in FIG. 6, a second gate electrode material is deposited overlying the insulating dielectric layer 32 to form a second gate electrode layer 36. In an exemplary embodiment, the second gate electrode layer 36 overlies the insulating dielectric layer 32 and the exposed portions 34 of the first gate electrode layer 26 such that the first gate electrode layer 26 and the second gate electrode layer 36 overlying the second device well 16 and the third device well 18 are in direct contact through the exposed portions 34. To this end, the first gate electrode layer 26 and the second gate electrode layer 36 overlying the second device well 16 and the third device well 18 function as a single gate electrode, which in turn is suitable to be utilized with high voltage devices due to the increased thickness of the gate electrode. In contrast, the first gate electrode layer 26 and the second gate electrode layer 36 overlying the first device well 14 are isolated from each other by the insulating dielectric layer 32. To this end, the first gate electrode layer 26 and the second gate electrode layer 36 overlying the first device well 14 may be configured to function as a floating gate and a control gate, which in turn is suitable to be utilized with memory cells. The second gate electrode material may include, but is not limited to, conventional materials including copper, silver, and doped or undoped polycrystalline silicon. In certain embodiments, the second gate electrode material includes polycrystalline silicon with impurities.

Figure 7:
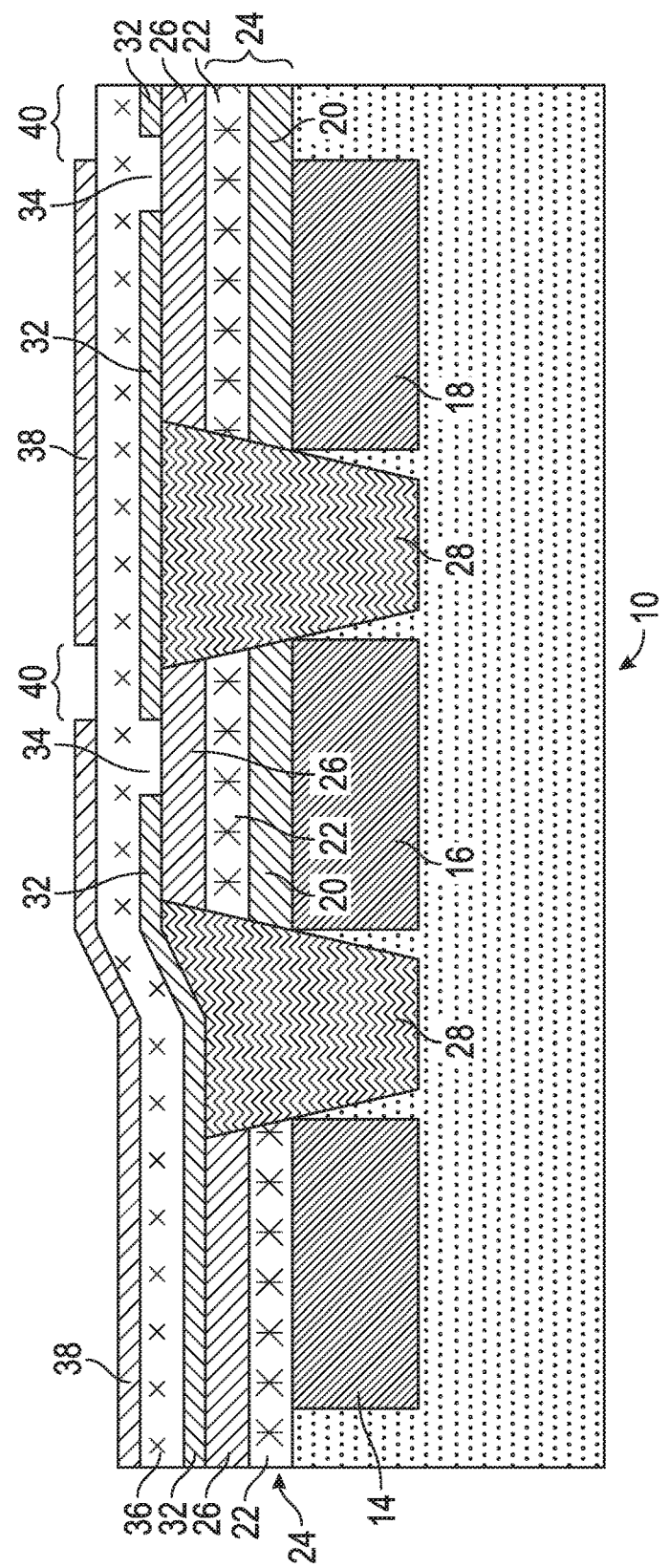

In an embodiment and as shown in FIG. 7, a hard mask layer 38 is formed only partially overlying the second gate electrode layer 36, with at least a portion of the hard mask layer 38 removed over the second device well 16 and the third device well 18. The phrase "only partially overlying" with reference to the hard mask layer 38 means that the hard mask layer 38 overlies a surface of the second gate electrode layer 36 over the first device well 14 but only overlies the second device well 16 or the third device well 18 in an amount of no greater than 99%, 95%, 90%, 80%, 70%, or 50%, based on total surface area of the second gate electrode layer 36 overlying the second device well 16 or the third device well 18. To form the hard mask layer 38, a hard mask material is deposited overlying the second gate electrode layer 36. The hard mask layer 38 may then be patterned to expose portions 40 of the second gate electrode layer 36 overlying the second device well 16 and the third device well 18 where contacts are to be formed. In certain embodiments, the portions 40 are exposed through the hard mask layer 38 in an amount of no greater than 99%, 90%, 75%, 50%, 25%, 20%, 15%, or 10%, alternatively, in an amount of from at least 1%, 10%, 15%, 20%, 25%, 50%, 75%, 90%, or 99%, or alternatively, in an amount of from 1 to 99%, 10 to 99% 10 to 90%, 10 to 75%, or 10 to 50%, based on total surface area of the second gate electrode layer 36 directly overlying the second device well 16 and the third device well 18. Patterning may include formation of a photoresist layer (not illustrated) and a mask (not illustrated), and etching with an appropriate etchant to expose the portions 40. In an exemplary embodiment, the hard mask material may include silicon nitride, but other hard mask materials may also be used in alternate embodiments, such as silicon carbon nitride. Silicon nitride may be deposited and etched as described above. In this embodiment, the hard mask layer 38 is formed such that the exposed portions 40 of the second gate electrode layer 36 directly overlie dielectric material of the insulating dielectric layer 32, which directly overlies the second device well 16 and the third device well 18.

Figure 8:
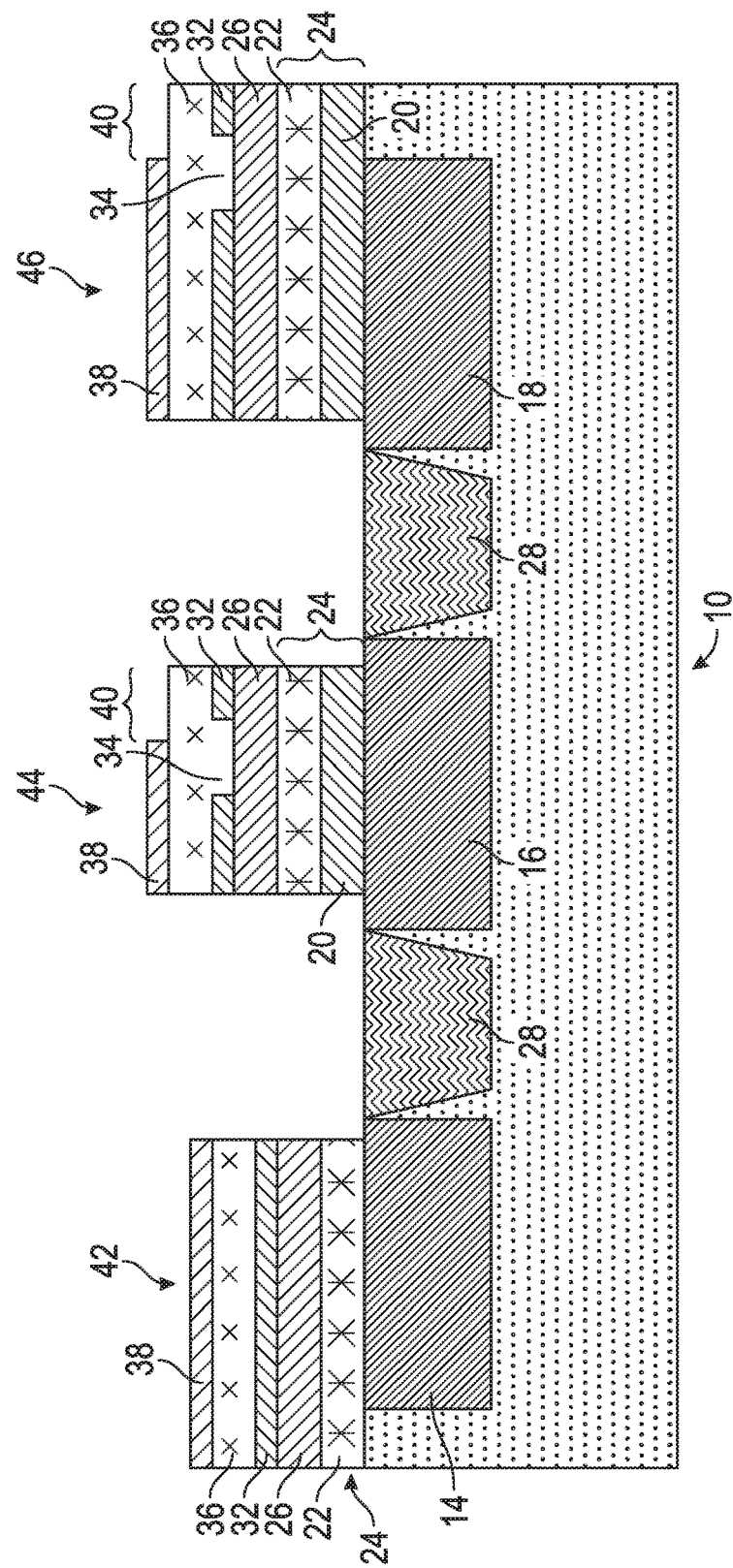

In an embodiment and as shown in FIG. 8, the hard mask layer 38, the second gate electrode layer 36, the insulating dielectric layer 32, the first gate electrode layer 26, and the gate dielectric 24 may then be patterned to form a first gate structure 42 overlying the first device well 14, a second gate structure 44 overlying the second device well 16, and a third gate structure 46 overlying the third device well 18. Patterning may include formation of a photoresist layer (not illustrated) and a mask (not illustrated), and etching with a reactive ion etch using appropriate etchants, where the layers may be removed individually with appropriate etchants.

As introduced above and in an embodiment, the first gate structure 42 includes the gate dielectric 24 only formed from the second gate dielectric layer 22. Furthermore, the first gate structure 42 includes the first gate electrode layer 26 isolated from the second gate electrode layer 36 by the insulating dielectric layer 32 which results in a configuration suitable for a floating gate and a control gate of a memory cell. In certain embodiments, the first gate electrode layer 26 of the first gate structure 42 is further defined as a floating gate and the second gate electrode layer 36 of the first gate structure 42 is further defined as a control gate. In various embodiments, the first gate structure 42 and the first device well 14 are utilized to form a memory cell, such as for a non-volatile memory device.

In contrast and in an embodiment, the second gate structure 44 and the third gate structure 46 include the gate dielectric 24 formed from both the first gate dielectric layer 20 and the second gate dielectric layer 22 which results in the second gate structure 44 and the third gate structure 46 including the gate dielectric 24 having an increased thickness. Gate structures including gate dielectrics having an increased thickness are suitable for high voltage devices. Furthermore, the second gate structure 44 and the third gate structure 46 include the first gate electrode layer 26 in direct contact with the second gate electrode layer 36 through the exposed portions 34 which results in a single gate electrode having an increased thickness. Gate structures including gate dielectrics having an increased thickness are suitable for high voltage devices due to the increase in the blocking voltage threshold of the devices. In certain embodiments, the second gate structure 44 and the second device well 16 are utilized to form a first high voltage device and the third gate structure 46 and the third device well 18 are utilized to form a second high voltage device. In these embodiments, the first high voltage device and the second high voltage device may be utilized to form a complementary metal oxide semiconductor (CMOS) device.

Figure 9:
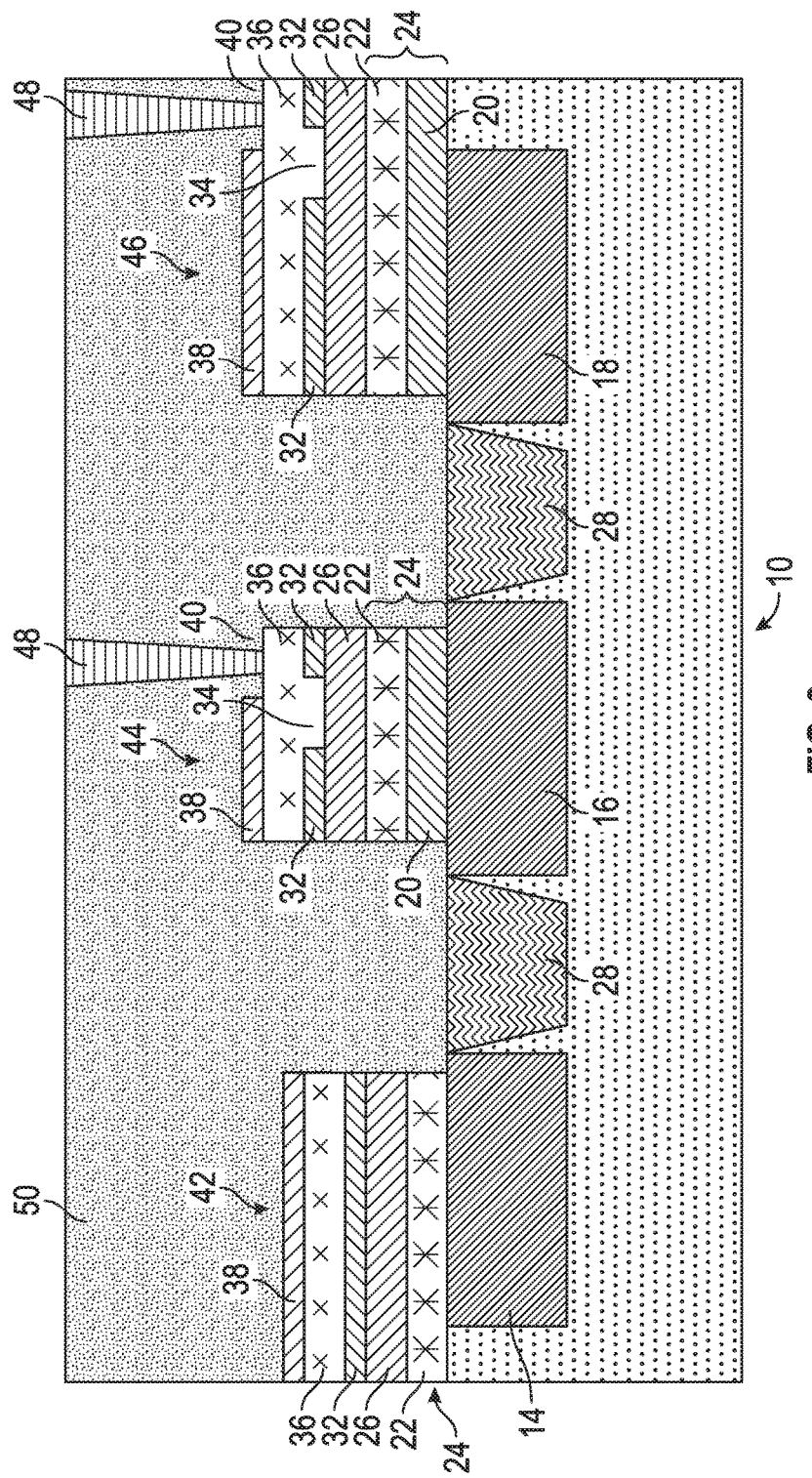

In an embodiment and as shown in FIG. 9, a contact 48 is formed on the second gate electrode layer 36 of the second gate structure 44 and the third gate structure 46 with the contact 48 overlying dielectric material of the insulating dielectric layer 32. In certain embodiments, the contact 48 is formed on the second gate electrode layer 36 of the second gate structure 44 and the third gate structure 46 with the contact 48 directly overlying dielectric material of the insulating dielectric layer 32. Without being bound by theory, landing of the contact 48 overlying the dielectric material of the insulating dielectric layer 32 minimizes diffusion of metal ions through the first gate electrode layer 26 and into the gate dielectric 24. In certain embodiments, the second gate structure 44 and the third gate structure 46 are free of a high-κ metal gate. Because the contact 48 lands on the second gate electrode layer 36 of the second gate structure 44 and the third gate structure 46 with the contact 48 overlying the dielectric material of the insulating dielectric layer 32, the high-κ metal gate is unnecessary to inhibit diffusion of the metal ions through the first gate electrode layer 26 and into the gate dielectric 24. It is to be appreciated that a contact can be formed coupled to the second gate electrode layer 36 of the first gate structure 42.

In an exemplary embodiment, the contact 48 is formed on the exposed portions 40 of the second gate electrode layer 36. To form the contact 48 on the exposed portions 40, an interlayer dielectric (ILD) material is deposited overlying the hard mask layer 38 and the exposed portions 40 to form an ILD layer 50. The ILD layer 50 may then be patterned to form contact trenches which extend to the exposed portions 40. A metal is then deposited in the contact trenches such that the contacts 48 are formed on the exposed portions 40. Patterning of the ILD layer 50 may include formation of a photoresist layer (not illustrated) and a mask (not illustrated), and etching using an appropriate etchant to form the contact trenches. The ILD material may include, but is not limited to, silicon dioxide, silicon nitride, or the like. Silicon dioxide and silicon nitride may be deposited and etched as described above.

The metal of the contact 48 may include, but is not limited to, copper, aluminum, titanium, or other conductive materials. The metal may be deposited through conventional fabrication techniques, such as chemical vapor deposition (CVD) and physical vapor deposition (PVD). In one exemplary embodiment, the metal includes copper and is formed by first depositing a copper seed layer (not illustrated) using a chemical vapor deposition and then electrolessly depositing copper (not illustrated) by exposing the contact trenches to an electroless deposition solution. In another exemplary embodiment, the contact 48 includes an adhesion layer, a barrier layer, and a plug (where each component of the contact is not individually illustrated), which are sequentially deposited. For example, an adhesion layer of titanium is formed by low pressure chemical vapor deposition (LP-CVD) of titanium pentachloride, a barrier layer of titanium nitride is formed by chemical vapor deposition (CVD) of titanium tetrabromide and ammonia, and a plug of tungsten is formed by chemical vapor deposition (CVD) of tungsten hexafluoride and hydrogen.

Figure 10:
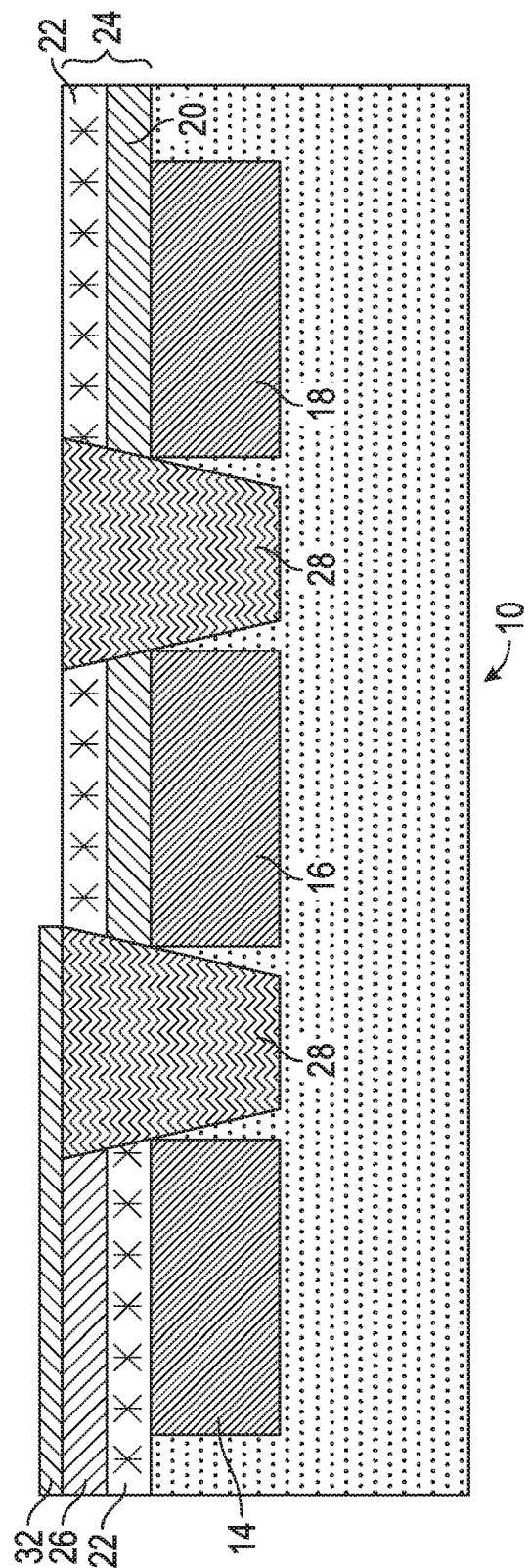

As shown in FIG. 10, another embodiment of the integrated circuit is illustrated. In this embodiment, the integrated circuit is formed according to FIGS. 1-4 described above. In an exemplary embodiment, the insulating dielectric layer 32 is formed only partially overlying the first gate electrode layer 26, with the insulating dielectric layer 32 removed over the second device well 16 and the third device well 18. The phrase "only partially overlying" with reference to the insulating dielectric layer 32 means that the insulating dielectric layer 32 overlies a surface of the first gate electrode layer 26 over the first device well 14 but does not overlie the second device well 16 or the third device well 18. To form the insulating dielectric layer 32, the insulating dielectric material is deposited overlying the first gate electrode layer 26. The insulating dielectric layer 32 may then be patterned to expose the gate dielectric 24 overlying the second device well 16 and the third device well 18 such that the second device well 16 and the third device well 18 are free of the insulating dielectric layer 32 thereover.

Figure 11:
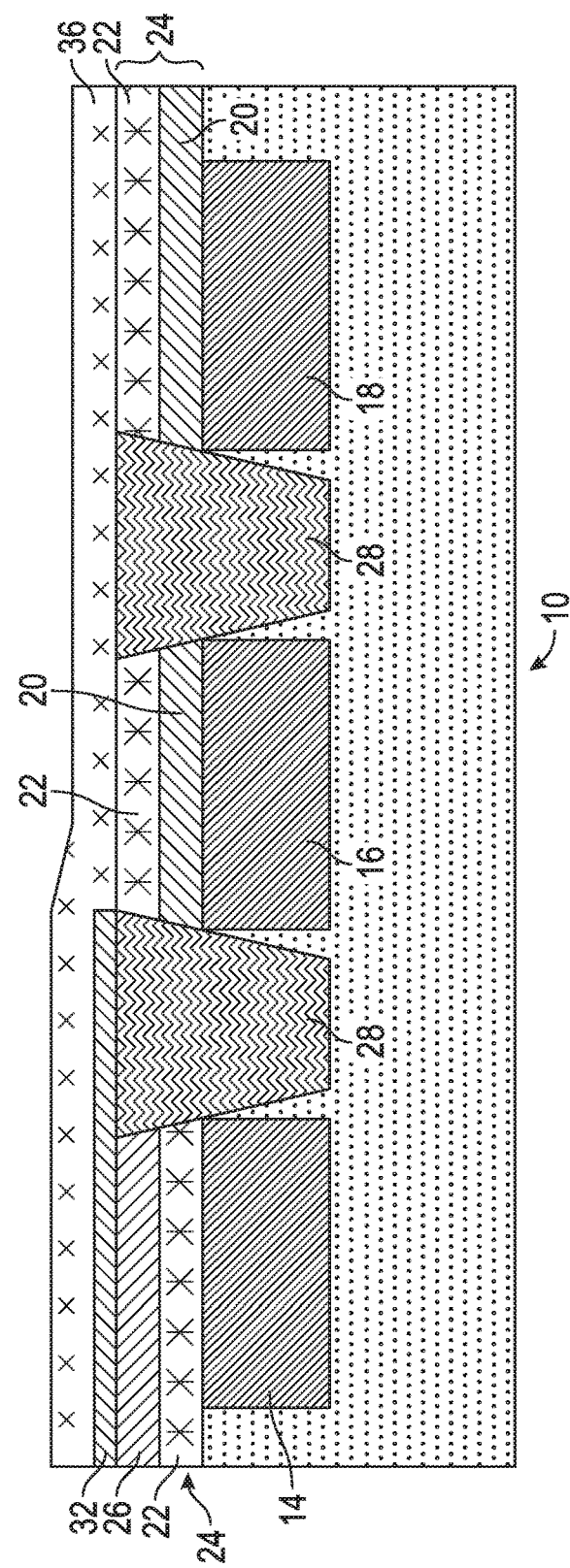

In an embodiment and as shown in FIG. 11, the second gate electrode material is deposited overlying the insulating dielectric layer 32 to form the second gate electrode layer 36. In an exemplary embodiment, the second gate electrode layer 36 overlies the insulating dielectric layer 32 and the gate dielectric 24 such that the second gate electrode layer 36 overlying the second device well 16 and the third device well 18 is directly overlying the gate dielectric 24. In contrast, the first gate electrode layer 26 and the second gate electrode layer 36 overlying the first device well 14 are isolated from each other by the insulating dielectric layer 32. To this end, the first gate electrode layer 26 and the second gate electrode layer 36 overlying the first device well 14 may be configured to function as a floating gate and a control gate, which in turn is suitable to be utilized with memory cells.

Figure 12:
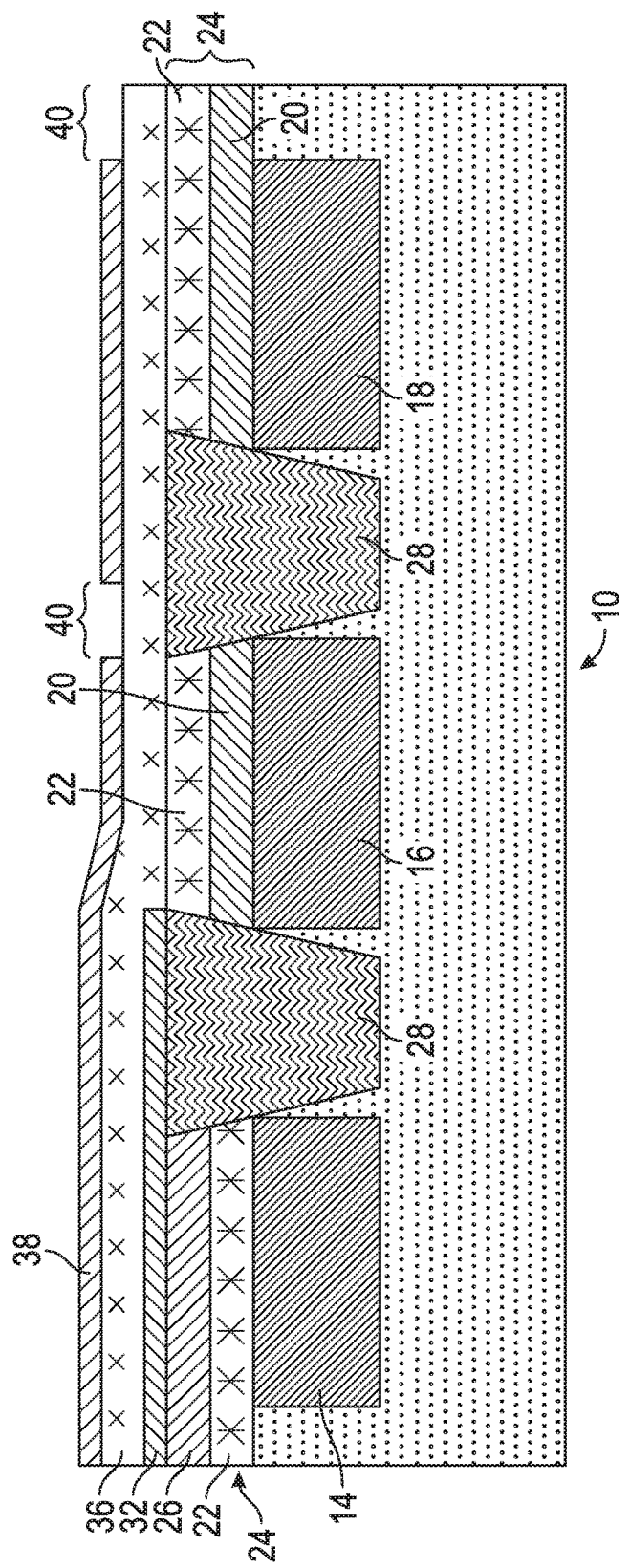

In an embodiment and as shown in FIG. 12, the hard mask layer 38 is formed only partially overlying the second gate electrode layer 36, with at least a portion of the hard mask layer 38 removed over the second device well 16 and the third device well 18. The phrase "only partially overlying" with reference to the hard mask layer 38 means that the hard mask layer 38 overlies a surface of the second gate electrode layer 36 over the first device well 14 but only overlies the second device well 16 or the third device well 18 in an amount of no greater than 99%, 95%, 90%, 80%, 70%, or 50%, based on total surface area of the second gate electrode layer 36 overlying the second device well 16 or the third device well 18. To form the hard mask layer 38, the hard mask material is deposited overlying the second gate electrode layer 36. The hard mask layer 38 may then be patterned to expose portions 40 of the second gate electrode layer 36 overlying the STI structure 28 where contacts are to be formed. In certain embodiments, the portions 40 are exposed through the hard mask layer 38 in an amount of no greater than 99%, 90%, 75%, 50%, 25%, 20%, 15%, or 10%, alternatively, in an amount of from at least 1%, 10%, 15%, 20%, 25%, 50%, 75%, 90%, or 99%, or alternatively, in an amount of from 1 to 99%, 10 to 99% 10 to 90%, 10 to 75%, or 10 to 50%, based on total surface area of the second gate electrode layer 36 directly overlying the STI structure 28. In certain embodiments, the hard mask layer 38 is formed such that the exposed portions 40 of the second gate electrode layer 36 directly overlie dielectric material of the STI structure 28.

Figure 13:
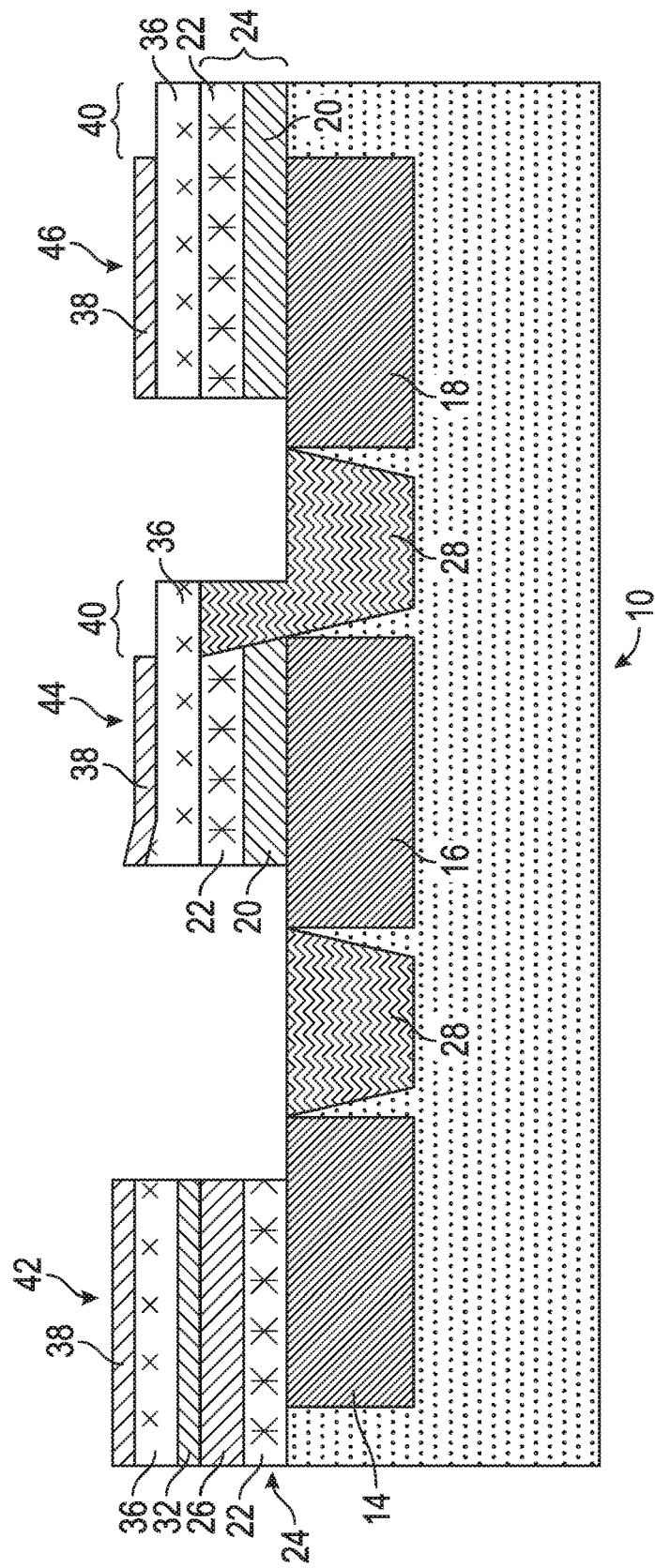

In an embodiment and as shown in FIG. 13, the hard mask layer 38, the second gate electrode layer 36, the insulating dielectric layer 32, the first gate electrode layer 26, and the gate dielectric 24 may then be patterned to form the first gate structure 42 overlying the first device well 14, the second gate structure 44 overlying the second device well 16 and the STI structure 28, and the third gate structure 46 overlying the third device well 18 and the semiconductor substrate 10.

Figure 14:
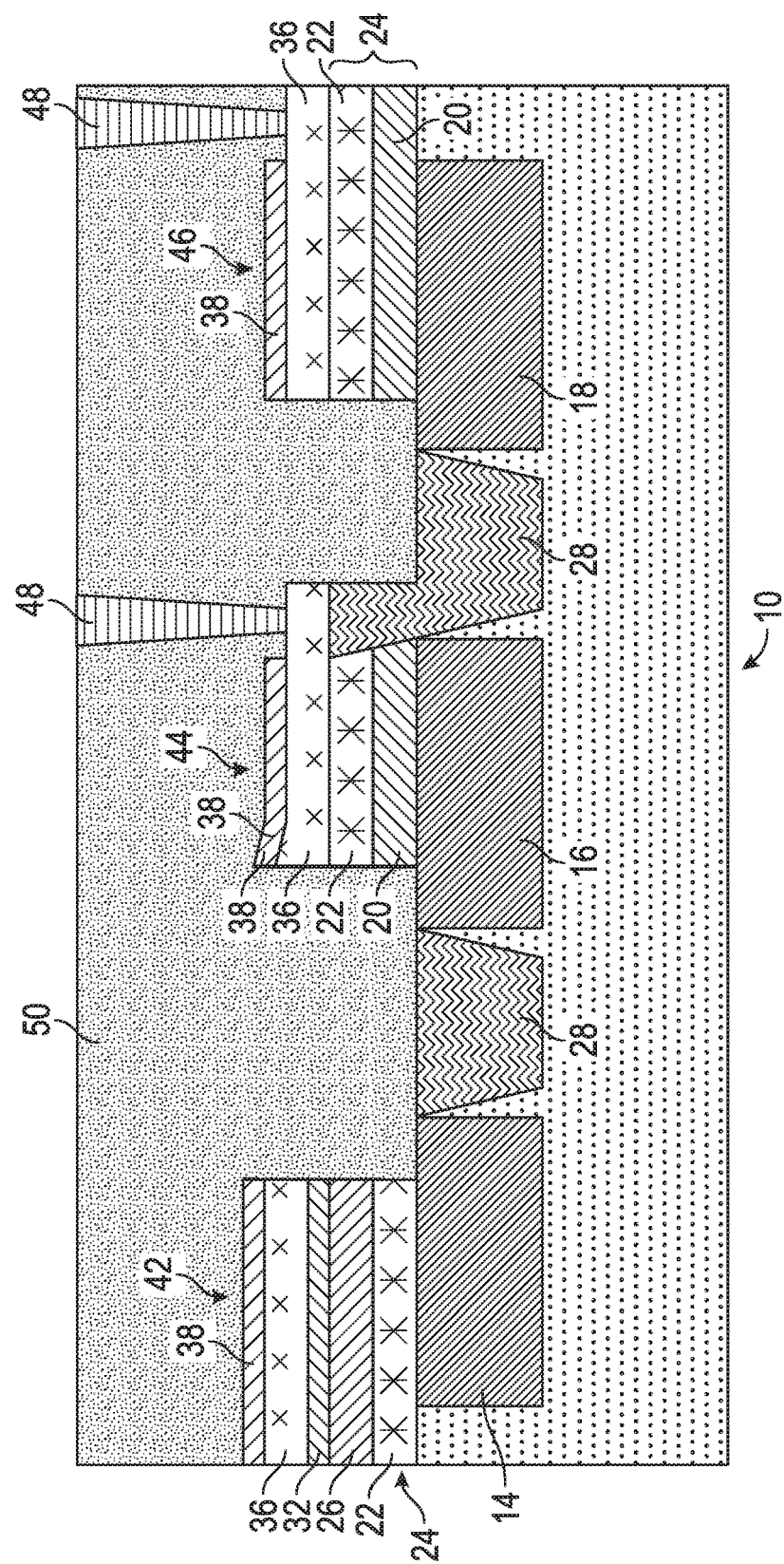

In an embodiment and as shown in FIG. 14, the contact 48 is formed on the second gate electrode layer 36 of the second gate structure 44 with the contact 48 overlying dielectric material of the STI structure 28 and formed on the third gate structure 46 with the contact 48 overlying dielectric material of the semiconductor substrate 10. In certain embodiments, the contact 48 is formed on the second gate electrode layer 36 of the second gate structure 44 with the contact 48 directly overlying dielectric material of the STI structure 28 and formed on the third gate structure 46 with the contact 48 directly overlying dielectric material of the semiconductor substrate 10. Without being bound by theory, landing of the contact 48 overlying the dielectric material of the STI structure 28 or the semiconductor substrate 10 minimizes diffusion of metal ions through the second gate electrode layer 36 and into the gate dielectric 24. Because the contact 48 lands on the second gate electrode layer 36 of the second gate structure 44 and the third gate structure 46 with the contact 48 overlying the dielectric material of the STI structure 28 or the semiconductor substrate 10, the high-κ metal gate is unnecessary to inhibit diffusion of the metal ions through the second gate electrode layer 36 and into the gate dielectric 24. It is to be appreciated that a contact can be formed coupled to the second gate electrode layer 36 of the first gate structure 42.

In an exemplary embodiment, the contact 48 is formed on the exposed portions 40 of the second gate electrode layer 36. To form the contact 48 on the exposed portions 40, the ILD material is deposited overlying the hard mask layer 38 and the exposed portions 40 to form to ILD layer 50. The ILD layer 50 may then be patterned to form contact trenches which extend to the exposed portions 40. The metal is then deposited in the contact trenches such that the contacts 48 are formed on the exposed portions 40. Patterning and etching of the ILD layer 50 may proceed as described above. The metal is deposited as described above.

In an embodiment, spacers (not illustrated) formed on sidewalls of the second gate structure 44 and the third gate structure 46 have an increased thickness as compared to spacers of conventional devices as a result of the coordinated manufacturing processes for both the memory cells and the high voltage devices of the integrated circuit. Specifically, the spacers of the second gate structure 44 and the third gate structure 46 may include spacer material formed for the memory cells and spacer material formed for the high voltage devices with the spacer materials combined to form the spacers of the second gate structure 44 and the third gate structure 46.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method for fabricating an integrated circuit, wherein the method comprises:
   providing a semiconductor substrate having a first device well and a second device well, a gate dielectric overlying the first device well and the second device well, a first gate electrode layer overlying the gate dielectric, and a shallow trench isolation structure within the substrate between the first device well and the second device well;
   forming an insulating dielectric layer only partially overlying the first gate electrode layer;
   depositing a second gate electrode material overlying at least the insulating dielectric layer to form a second gate electrode layer;
   patterning at least the gate dielectric layer and the second gate electrode layer to form a first gate structure overlying the first device well and a second gate structure overlying the second device well; and
   forming a contact on the second gate electrode layer of the second gate structure with the contact overlying dielectric material of at least one of the insulating dielectric layer or the shallow trench isolation structure.

2. The method of claim 1, wherein forming the contact on the second gate electrode layer of the second gate structure comprises forming the contact on the second gate electrode layer of the second gate structure with the contact overlying the insulating dielectric layer of the second gate structure.

3. The method of claim 2, wherein forming the contact on the second gate electrode layer further comprises:
   depositing a hard mask material overlying the second gate electrode layer to form a hard mask layer;
   patterning the hard mask layer of the second gate structure to expose a portion of the second gate electrode layer of the second gate structure with the exposed portion of the second gate electrode layer overlying the insulating dielectric layer of the second gate structure.

4. The method of claim 1, wherein forming the insulating dielectric layer comprises:
   depositing an insulating dielectric material overlying the first gate electrode layer to form the insulating dielectric layer; and
   patterning the insulating dielectric layer to expose a portion of the first gate electrode layer overlying the second device well prior to depositing the second gate electrode material.

5. The method of claim 4, wherein depositing the second gate electrode material comprises depositing the second gate electrode material overlying the insulating dielectric layer and the exposed portion of the first gate electrode layer to form the second gate electrode layer.

6. The method of claim 1, wherein forming the contact on the second gate electrode layer of the second gate structure comprises disposing the contact on the second gate electrode layer of the second gate structure with the contact overlying the shallow trench isolation structure.

7. The method of claim 6, wherein forming the contact on the second gate electrode layer further comprises:
   depositing a hard mask material overlying the second gate electrode layer to form a hard mask layer;
   patterning the hard mask layer of the second gate structure to expose a portion of the second gate electrode layer with the exposed portion of the second gate electrode overlying the shallow trench isolation structure.

8. The method of claim 1, wherein forming the insulating dielectric layer comprises:
   depositing an insulating dielectric material overlying the first gate electrode layer to form the insulating dielectric layer; and
   patterning the insulating dielectric layer and the first gate electrode layer to expose the gate dielectric overlying the second device well such that the first device well is free of the insulating dielectric layer thereover.

9. The method of claim 8, wherein depositing the second gate electrode material comprises depositing the second gate electrode material overlying the insulating dielectric layer overlying the first device well and the gate dielectric overlying the second device well to form the second gate electrode layer.

10. The method of claim 1, wherein providing the semiconductor substrate having the gate dielectric comprises providing the semiconductor substrate having the gate dielectric comprising a first gate dielectric layer and a second gate dielectric layer.

11. The method of claim 10, wherein providing a semiconductor substrate comprises:
    providing the semiconductor substrate having the first device well and the second device well;
    depositing a first gate dielectric material overlying the first device well and the second device well to form the first gate dielectric layer;
    patterning the first gate dielectric layer overlying the first device well to expose the first device well such that the first device well is free of the first gate dielectric layer thereover;
    depositing a second gate dielectric material overlying the first device well and over the first gate dielectric layer which is overlying the second device well to form the second gate dielectric layer;
    depositing a first gate electrode material overlying the second gate dielectric layer to form the first gate electrode layer; and
    forming a shallow trench isolation structure within the substrate between the first device well and the second device well.

12. The method of claim 11, wherein the shallow trench isolation structure is formed after forming the first gate electrode layer such that the first gate electrode layer is defined by forming the shallow trench isolation structure.

13. The method of claim 1, wherein the first gate electrode layer of the first gate structure is further defined as a floating gate and the second gate electrode layer of the first gate structure is further defined as a control gate.

14. The method of claim 1, wherein patterning at least the gate dielectric layer and the second gate electrode layer to form the first gate structure overlying the first device well comprises patterning at least the gate dielectric layer and the second gate electrode layer to form the first gate structure overlying the first device well which are included in a non-volatile memory device.

15. The method of claim 1, wherein patterning at least the gate dielectric layer and the second gate electrode layer to form the second gate structure overlying the second device well comprises patterning at least the gate dielectric layer and the second gate electrode layer to form the second gate structure overlying the second device well which are included in a first high voltage device.

16. The method of claim 15, wherein patterning at least the gate dielectric layer and the second gate electrode layer further comprises forming a third gate structure overlying a third device well with the third gate structure and the third device well included in a second high voltage device.

17. The method of claim 1, wherein patterning at least the gate dielectric layer and the second gate electrode layer further comprises patterning the gate dielectric layer, the first gate electrode layer, the insulating dielectric layer, and the second gate electrode layer to form the first gate structure overlying the first device well and the second gate structure overlying the second device well.

18. The method of claim 1, wherein the second gate structure is free of a high-K metal gate.

19. A method for fabricating an integrated circuit, comprising:
providing a semiconductor substrate having a first device well and a second device well;
forming a gate dielectric overlying the first device well and the second device well;
forming a first gate electrode layer overlying the gate dielectric;
forming a shallow trench isolation structure within the substrate between the first device well and the second device well after forming the first gate electrode layer such that the first gate electrode layer is defined by forming the shallow trench isolation structure;
forming an insulating dielectric layer overlying the first gate electrode layer;
forming a second gate electrode layer overlying the insulating dielectric layer; and
forming a contact on the second gate electrode layer with the contact overlying dielectric material of at least one of the insulating dielectric layer or the shallow trench isolation structure.

20. An integrated circuit, comprising:
a semiconductor substrate having a first device well and a second device well;
a shallow trench isolation structure within the substrate between the first device well and the second device well;
a first gate structure overlying the first device well, the first gate structure comprising;
  a gate dielectric overlying the first device well,
  a first gate electrode layer overlying the gate dielectric,
  an insulating dielectric layer overlying the first gate electrode layer, and
  a second gate electrode layer overlying the insulating dielectric layer;
a second gate structure overlying the second device well, the second gate structure comprising;
  a gate dielectric overlying the second device well,
  optionally, a first gate electrode layer overlying the gate dielectric,
  optionally, an insulating dielectric layer partially overlying the first gate electrode layer,
  a second gate electrode layer overlying dielectric material of at least one of the insulating dielectric layer or the gate dielectric; and
  a contact formed on the second gate electrode layer with the contact overlying dielectric material of at least one of the insulating dielectric layer or the shallow trench isolation structure.

* * * * *